US008598447B2

(12) United States Patent
Yamaguchi et al.

(10) Patent No.: US 8,598,447 B2
(45) Date of Patent: Dec. 3, 2013

(54) PHOTOELECTRIC CONVERSION DEVICE (75) Inventors: Kengo Yamaguchi, Nagasaki (JP);
Satoshi Sakai, Kanagawa (JP);
Shigenori Tsuruga, Kanagawa (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 248 days.

(21) Appl. No.: 13/003,615

(22) PCT Filed: Aug. 20, 2009

(86) PCT No.: PCT/JP2009/064570
§ 371 (c)(1),
(2), (4) Date: Jan. 11, 2011

(87) PCT Pub. No.: WO2010/058640
PCT Pub. Date: May 27, 2010

(65) Prior Publication Data
US 2011/0120521 A1 May 26, 2011

(30) Foreign Application Priority Data
Nov. 19, 2008 (JP) ................................. 2008-295750

(51) Int. Cl.
H01L 31/042 (2006.01)

(52) U.S. Cl.
USPC ........... 136/256; 136/244; 136/253; 136/254; 136/255; 257/E31.001; 257/E31.011; 257/E31.126; 438/39; 438/74; 438/98

(58) Field of Classification Search
USPC .......... 136/244, 253, 255, 256; 257/E31.001, 257/E31.011, E31.126; 438/69, 74, 98
See application file for complete search history.

(56) References Cited

U.S. PATENT DOCUMENTS

| | | | | |
|---|---|---|---|---|
| 2008/0280119 A1* | 11/2008 | Kishimoto et al. | | 428/220 |
| 2009/0014064 A1* | 1/2009 | Shinohara | | 136/256 |

FOREIGN PATENT DOCUMENTS

| | | |
|---|---|---|
| CN | 1599052 A | 3/2005 |
| JP | 2003-115601 A | 4/2003 |
| JP | 3434259 B2 | 5/2003 |
| JP | 2008-270562 A | 11/2008 |

OTHER PUBLICATIONS

Ma et al., "Effects of Mg doping on the properties of highly transparent conductive and near infrared reflective Zn1-xMgxO:Ga films", Journal of Solid State Chemistry, Jan. 6, 2008.*
International Search Report of corresponding application No. PCT/JP2009/064570 mailed Nov. 24, 2009.
Chinese Office Action for Chinese Patent Application No. 200980129888.6 which corresponds to U.S. Appl. No. 13/003,615.
Notification of the Grant of Patent Right as issued on Mar. 1, 2013 in corresponding Chinese Patent Application No. 200980129888.6.

* cited by examiner

*Primary Examiner* — Jennifer Michener
*Assistant Examiner* — Matthew Martin
(74) *Attorney, Agent, or Firm* — Kanesaka Berner & Partners, LLP (57) ABSTRACT Provided is a photoelectric conversion device in which the conductivity after hydrogen-plasma exposure is set within an appropriate range, thereby suppressing the leakage current and improving the conversion efficiency. A photoelectric conversion device includes, on a substrate, a photoelectric conversion layer having at least two power generation cell layers, and an intermediate contact layer provided between the power generation cell layers. The intermediate contact layer mainly contains a compound represented by $Zn_{1-x}Mg_xO$ ($0.096 \leq x \leq 0.183$).

9 Claims, 8 Drawing Sheets

PHOTOELECTRIC CONVERSION DEVICE

RELATED APPLICATIONS

The present application is a U.S. National Phase of International Application Number PCT/JP2009/064570, filed Aug. 20, 2009, and claims priority from Japanese Application Number 2008-295750, filed Nov. 19, 2008.

TECHNICAL FIELD

The present invention relates to solar cells and in particular, to a thin-film solar cell fabricated by forming power generation layers.

BACKGROUND ART

As a photoelectric conversion device used for a solar cell that converts the energy in sunlight into electrical energy, there is a known thin-film silicon photoelectric conversion device having a photoelectric conversion layer fabricated by forming thin films of a p-type silicon semiconductor (p-layer), an i-type silicon semiconductor (i-layer), and an n-type silicon semiconductor (n-layer) by using a plasma CVD method or the like.

Thin-film silicon solar cells have the advantages that the area thereof can be easily increased, and only a small amount of material is used because the film thickness thereof is about one hundredth of that of crystalline solar cells. Therefore, thin-film silicon solar cells can be fabricated at lower cost than crystalline solar cells. However, thin-film silicon solar cells have the disadvantage that the conversion efficiency thereof is lower than that of crystalline solar cells. In this technical field, an improvement in the conversion efficiency is a key issue, and a tandem solar cell having a photoelectric conversion layer in which two power generation cell layers are laminated has been proposed.

In a tandem solar cell, in order to suppress dopant interdiffusion between a first power generation cell layer and a second power generation cell layer and to adjust the light distribution, an intermediate contact layer formed of a transparent conductive film is inserted therebetween. For the intermediate contact layer, Ga-doped ZnO (GZO) is used in general. GZO has a refractive index of 2.0, which is lower than Si, and is a material having excellent plasma resistance and excellent transparency.

However, since GZO has low resistivity, when it is used for an integrated solar cell module, it causes leakage current in a cell-connected portion, thereby reducing the open circuit voltage and FF. In order to prevent the leakage current, solutions have been proposed, such as adding a laser-processed portion to the structure of the connected portion. However, adding a new processed portion causes the problems of decreased effective area and increased cost.

An improvement in FF has been attempted by controlling the conductivity of GZO to increase the resistance of GZO. As described in PLT1, the conductivity of GZO can be controlled by reducing the amount of dopant or by adjusting the amount of oxygen supplied at the time of film formation to promote oxidation of GZO.

CITATION LIST

Patent Literature

{PTL 1}
Japanese Unexamined Patent Application, Publication No. 2003-115601

SUMMARY OF INVENTION

Technical Problem

If high-resistance GZO is used for the intermediate contact layer, as in PLT1, the conductivity of GZO obtained immediately after film formation can be reduced, but, when the second power generation cell layer is formed on the intermediate contact layer, it is exposed to hydrogen plasma, thereby increasing the conductivity of GZO by eight or nine orders of magnitude (in other words, reducing the resistance thereof), effectively causing leakage current. It is considered that the conductivity is increased because oxygen defects are easily caused in ZnO due to the hydrogen plasma.

The present invention has been made in view of the above-described problems and provides a photoelectric conversion device in which the conductivity obtained after hydrogen plasma exposure is set within an appropriate range, thereby suppressing the leakage current and improving the conversion efficiency.

Solution to Problem

In order to solve the above-described problems, the present invention provides a photoelectric conversion device including, on a substrate, a photoelectric conversion layer having at least two power generation cell layers, and an intermediate contact layer between the power generation cell layers, in which the intermediate contact layer mainly contains a compound represented by $Zn_{1-x}Mg_xO$ ($0.096 \leq x \leq 0.183$).

When the intermediate contact layer mainly contains a compound in which MgO is added to ZnO, a reduction in the resistance (in other words, an increase in the conductivity) after hydrogen-plasma exposure can be prevented. In particular, when a compound in which MgO is added to ZnO at a ratio of 9.6 mol % to 18.3 mol %, inclusive, is used, the leakage current in a cell-connected portion is suppressed, and the conductivity of the intermediate contact layer after hydrogen-plasma exposure can be set to a value at which an increase in the contact resistance is suppressed. Therefore, the form factor is improved, realizing a photoelectric conversion device having high conversion efficiency.

In the above-described invention, in order to control the conductivity, the intermediate contact layer may mainly contain a compound represented by $Ga_2O_3$-doped $Zn_{1-x}Mg_xO$ ($0.096 \leq x \leq 0.183$).

In the above-described invention, it is preferable that the sheet resistance of the intermediate contact layer obtained after being exposed to hydrogen plasma be 10 kΩ/□ to 100 kΩ/□, inclusive.

In order to suppress the form factor due to leakage current, it is preferable that the sheet resistance of the intermediate contact layer after hydrogen-plasma exposure be 10 kΩ/□ or more. On the other hand, if the intermediate contact layer is increased in resistance, the contact resistance (series resistance) in the lamination direction (in a direction perpendicular to the substrate film-formation surface) is increased.

Therefore, it is preferable that the sheet resistance of the intermediate contact layer after hydrogen-plasma exposure be 100 kΩ/□ or less.

An interfacial layer that mainly contains ZnO or a compound represented by $Zn_{1-x}Mg_xO$ ($0<x\leq0.096$) may be provided between one of the power generation cell layers close to the substrate and the intermediate contact layer.

In this way, when the interfacial layer mainly containing ZnO or $Zn_{1-x}Mg_xO$ that falls within the above-described composition range and that has a lower Mg concentration than the intermediate contact layer of the present invention is formed on the power generation cell layer formed closer to the substrate, the contact resistance in the film lamination direction can be further reduced. As a result, the form factor can be further improved, realizing a photoelectric conversion device having higher photoelectric conversion efficiency.

In this case, in order to adjust the conductivity of the interfacial layer, the interfacial layer may mainly contain $Ga_2O_3$-doped ZnO or a compound represented by $Ga_2O_3$-doped $Zn_{1-x}Mg_xO$ ($0<x\leq0.096$).

In the above-described invention, it is preferable that the film thickness of the interfacial layer be 5 nm to 10 nm, inclusive.

The contact resistance can be improved by forming the interfacial layer; however, when the interfacial layer is increased in thickness, the leakage current is increased, reducing the form factor. When the interfacial layer has a film thickness of 5 nm to 10 nm, inclusive, it is possible to realize both improved contact resistance and suppressed leakage resistance, thus improving the photoelectric conversion efficiency.

Advantageous Effects of Invention

When the intermediate contact layer mainly containing a compound represented by $Zn_{1-x}Mg_xO$ ($0.096\leq x\leq0.183$) is formed between the adjacent power generation cell layers, it is possible to suppress the leakage current in the cell-connected portion and to reduce the contact resistance in the film vertical direction. Therefore, the form factor is improved, thus realizing a photoelectric conversion device having high photoelectric conversion efficiency.

Further, when the interfacial layer mainly containing ZnO or $Zn_{1-x}Mg_xO$ that has a lower Mg concentration than the intermediate contact layer is formed between the power generation cell layer closer to the substrate and the intermediate contact layer, the contact resistance can also be reduced. As a result, the photoelectric conversion efficiency can be further improved.

DESCRIPTION OF EMBODIMENTS

Figure 1:
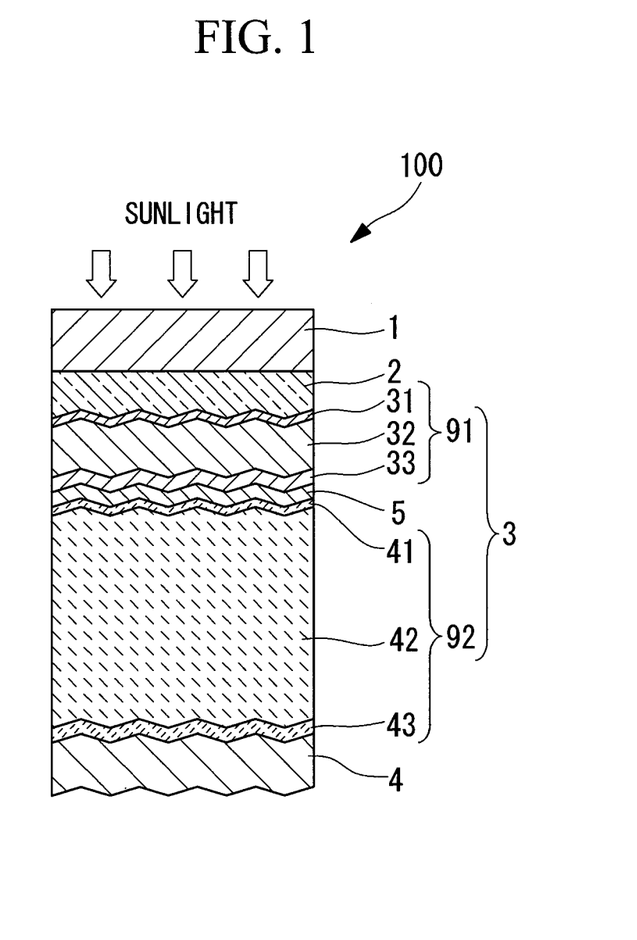
FIG. 1 is a sectional view schematically showing the structure of a photoelectric conversion device according to a first embodiment of the present invention.

FIG. 1 is a view showing, in outline, the configuration of a photoelectric conversion device according to the present invention. A photoelectric conversion device 100 is a tandem silicon solar cell and includes a substrate 1; a transparent electrode layer 2; a first power generation cell layer 91 (amorphous silicon) and a second power generation cell layer 92 (crystalline silicon) that serve as a solar-cell photoelectric conversion layer 3; an intermediate contact layer 5; and a back electrode layer 4. Here, silicon is a general term including silicon (Si), silicon carbide (SiC), and silicon germanium (SiGe). Further, crystalline silicon is intended to mean silicon other than amorphous silicon and also includes microcrystalline silicon and polycrystalline silicon.

First Embodiment

A method for fabricating a photoelectric conversion device according to a first embodiment will be described by using, as an example, the steps for fabricating a solar cell panel. FIGS. 2 to 5 are views showing, in outline, a method for fabricating a solar cell panel of this embodiment.

Figure 2:
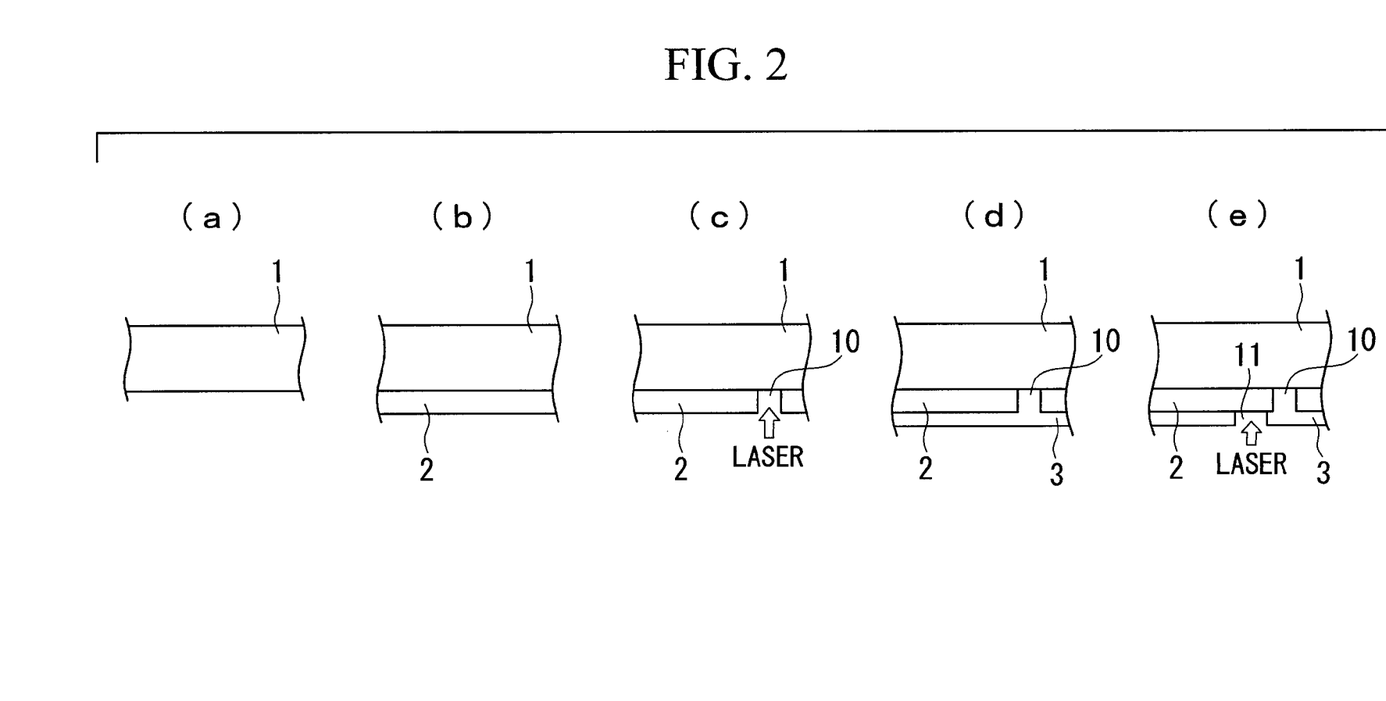
FIG. 2 is a view for explaining, in outline, one embodiment in which a solar cell panel is fabricated as the photoelectric conversion device according to the first embodiment of the present invention.

(1) FIG. 2(a)

As the substrate 1, a soda float glass substrate (with a substrate area of 1 m square or more, for example, 1.4 m×1.1 m×plate thickness: 3.5 mm to 4.5 mm) is used. It is preferable that end faces of the substrate be subjected to a corner chamfering process or an R-chamfering process in order to avoid damage caused by thermal stress, impacts, or the like.

(2) FIG. 2(b)

As the transparent electrode layer 2, a transparent electrode film composed mainly of tin oxide ($SnO_2$) and having a film thickness of about 500 nm to 800 nm, inclusive, is formed at about 500° C. using a thermal CVD apparatus. At this time, a suitable uneven texture is formed on the surface of the transparent electrode film. As the transparent electrode layer 2, in addition to the transparent electrode film, an alkali barrier film (not shown) may be formed between the substrate 1 and the transparent electrode film. The alkali barrier film is obtained when a silicon oxide film ($SiO_2$) having a thickness of 50 nm to 150 nm is formed at about 500° C. using a thermal CVD apparatus.

(3) FIG. 2(c)

Thereafter, the substrate 1 is placed on an X-Y table and is irradiated with the first harmonic (1064 nm) of a YAG laser from the film surface of the transparent electrode film, as shown by the arrow in the figure. The laser power is adjusted so as to be appropriate for the processing speed, and the laser light is moved relative to the substrate 1, over the transparent electrode film in a direction perpendicular to the series-connection direction of power generation cells, thus applying laser etching so as to form a groove 10 into a rectangular shape with a predetermined width of about 6 mm to 15 mm.

(4) FIG. 2(*d*)

As the first power generation cell layer 91, a p-layer, an i-layer, and an n-layer that are each formed of an amorphous silicon thin film are formed using a plasma CVD apparatus. By using $SiH_4$ gas and $H_2$ gas as main materials, under the following conditions: a low-pressure atmosphere of 30 Pa to 1000 Pa, inclusive, and a substrate temperature of about 200° C., an amorphous silicon p-layer 31, an amorphous silicon i-layer 32, and an amorphous silicon n-layer 33 are formed on the transparent electrode layer 2 in this order from the side on which sunlight is incident. The amorphous silicon p-layer 31 is formed mainly of B-doped amorphous silicon and has a film thickness of 10 nm to 30 nm, inclusive. The amorphous silicon i-layer 32 has a film thickness of 200 nm to 350 nm, inclusive. The amorphous silicon n-layer 33 is formed manly of P-doped silicon, in which microcrystalline silicon is contained in amorphous silicon, and has a film thickness of 30 nm to 50 nm, inclusive. A buffer layer may be provided between the amorphous silicon p-layer 31 and the amorphous silicon i-layer 32 in order to improve the interfacial properties.

The intermediate contact layer 5, which is a semi-reflective film, is provided between the first power generation cell layer 91 and the second power generation cell layer 92 in order to improve the contact properties therebetween and to achieve current consistency. The intermediate contact layer 5 is formed using an RF magnetron sputtering apparatus, under the following conditions: a $Ga_2O_3$-doped ZnO—MgO mixture target (MgO ratio: 5 to 10 mass %), an RF power of 1.1 to 4.4 W/cm$^2$, a film-forming pressure of 0.13 to 0.67 Pa, and a substrate temperature of 25° C. (near room temperature). Thus, the intermediate contact layer is formed, which has a film thickness of 20 nm to 100 nm, inclusive, and which is formed mainly of $Zn_{1-x}Mg_xO$ ($0.096 \leq x \leq 0.183$). The intermediate contact layer 5, upon being just formed, has a sheet resistance of about 10 MΩ/□. Note that the intermediate contact layer need not contain $Ga_2O_3$.

Next, on the first power generation cell layer 91, a crystalline silicon p-layer 41, a crystalline silicon i-layer 42, and a crystalline silicon n-layer 43 are sequentially formed as the second power generation cell layer 92, by using a plasma CVD apparatus, under the following conditions: a low-pressure atmosphere of 3000 Pa or less, a substrate temperature of about 200° C., and a plasma generation frequency of 40 MHz to 100 MHz, inclusive. The crystalline silicon p-layer 41 is formed mainly of B-doped microcrystalline silicon and has a film thickness of 10 nm to 50 nm, inclusive. The crystalline silicon i-layer 42 is formed mainly of microcrystalline silicon and has a film thickness of 1.2 μm to 3.0 μm, inclusive. The crystalline silicon n-layer 43 is formed mainly of P-doped microcrystalline silicon and has a film thickness of 20 nm to 50 nm, inclusive. Here, an amorphous silicon n-layer may be formed at the interface between the crystalline silicon i-layer 42 and the crystalline silicon n-layer 43.

When the i-layer formed mainly of microcrystalline silicon is formed by the plasma CVD method, it is preferable to set a distance d between the plasma discharge electrode and the surface of the substrate 1 at 3 mm to 10 mm, inclusive. When it is less than 3 mm, it becomes difficult to keep the distance d constant because of the precision of individual constituent devices in a film-formation chamber compatible with large substrates, and there is a risk of the discharge becoming unstable when they get too close to each other. When it is more than 10 mm, it is difficult to achieve an adequate film-formation speed (1 nm/s or more), the plasma uniformity decreases, and the film quality is reduced due to ion bombardment.

During the formation of the second power generation cell layer, the intermediate contact layer is exposed to hydrogen plasma. As a result, the resistance of the intermediate contact layer is reduced.

Figure 6:
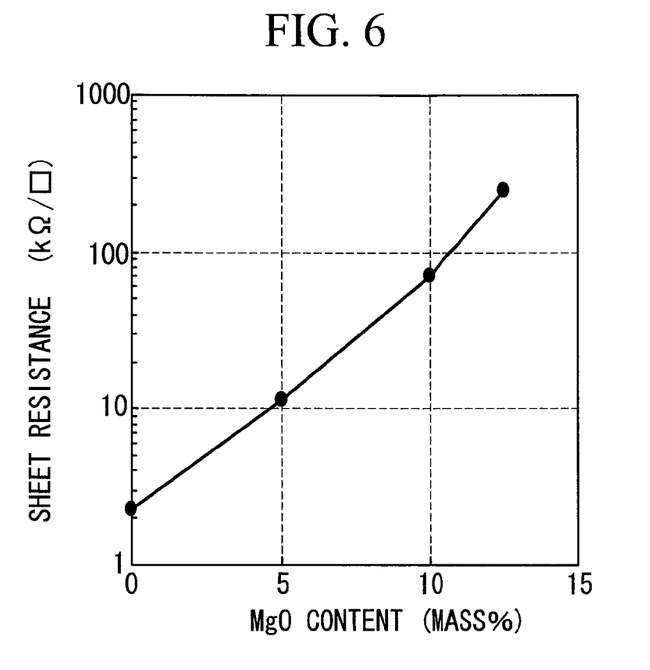
FIG. 6 is a graph showing the relationship between the MgO content in a ZnMgO film and the sheet resistance after hydrogen plasma treatment.

FIG. 6 shows the relationship between the MgO content in a ZnMgO compound and the sheet resistance of a ZnMgO film obtained after the hydrogen plasma treatment. In this figure, the horizontal axis shows the MgO content, and the vertical axis shows the sheet resistance. The ZnMgO film is formed under the following conditions: a ZnO sintered compact ($Ga_2O_3$ dopant) target or a ZnO—MgO mixture target ($Ga_2O_3$ dopant, MgO mass ratio: 5 to 12.5%), a substrate temperature of 25° C., an μF power of 4.4 W/cm$^2$, a target-to-substrate distance of 90 mm, a film-formation speed of 0.17 nm/s, and a film thickness of 70 nm. After the ZnMgO film is formed, the hydrogen plasma treatment is performed under the following conditions: an $H_2$ gas flow of 0.1 slm, a pressure of 133 Pa, an applied power density of 0.5 W/cm$^2$, and a treatment time of 5 minutes.

When the influence on the form factor is analyzed using an equivalent circuit corresponding to the module structure of this embodiment, the leakage current can be reduced when the sheet resistance of the intermediate contact layer is 10 kΩ/□ or more. Furthermore, in the film vertical direction (lamination direction), it is essential to reduce the contact resistance, which causes an increase in series resistance. As a result of the analysis, it is preferable to set the sheet resistance of the intermediate contact layer at 100 kΩ/□.

From FIG. 6, when the MgO mass ratio is 5% (9.6 mol %) to 10% (18.3 mol %), a ZnMgO film having a sheet resistance of 10 kΩ/□ to 100 kΩ/□, inclusive, can be obtained.

(5) FIG. 2(*e*)

The substrate 1 is placed on the X-Y table and is irradiated with the second harmonic (532 nm) of a laser-diode-pumped YAG laser from the film surface side of the photoelectric conversion layer 3, as shown by the arrow in the figure. The laser power is adjusted so as to be appropriate for the processing speed, with a pulse oscillation of 10 kHz to 20 kHz, and laser etching is performed so as to form a groove 11 at a position about 100 μm to 150 μm away laterally from a laser etching line on the transparent electrode layer 2. The laser may be radiated from the substrate 1 side, and in this case, because the photoelectric conversion layer 3 can be etched using high-pressure vapor generated with the energy absorbed in the first power generation cell layer, formed of amorphous silicon, of the photoelectric conversion layer 3, it is possible to perform laser etching even more stably. The position of the laser etching line is selected in consideration of the positional tolerance so as not to intersect the etching line in the previous step.

Figure 3:
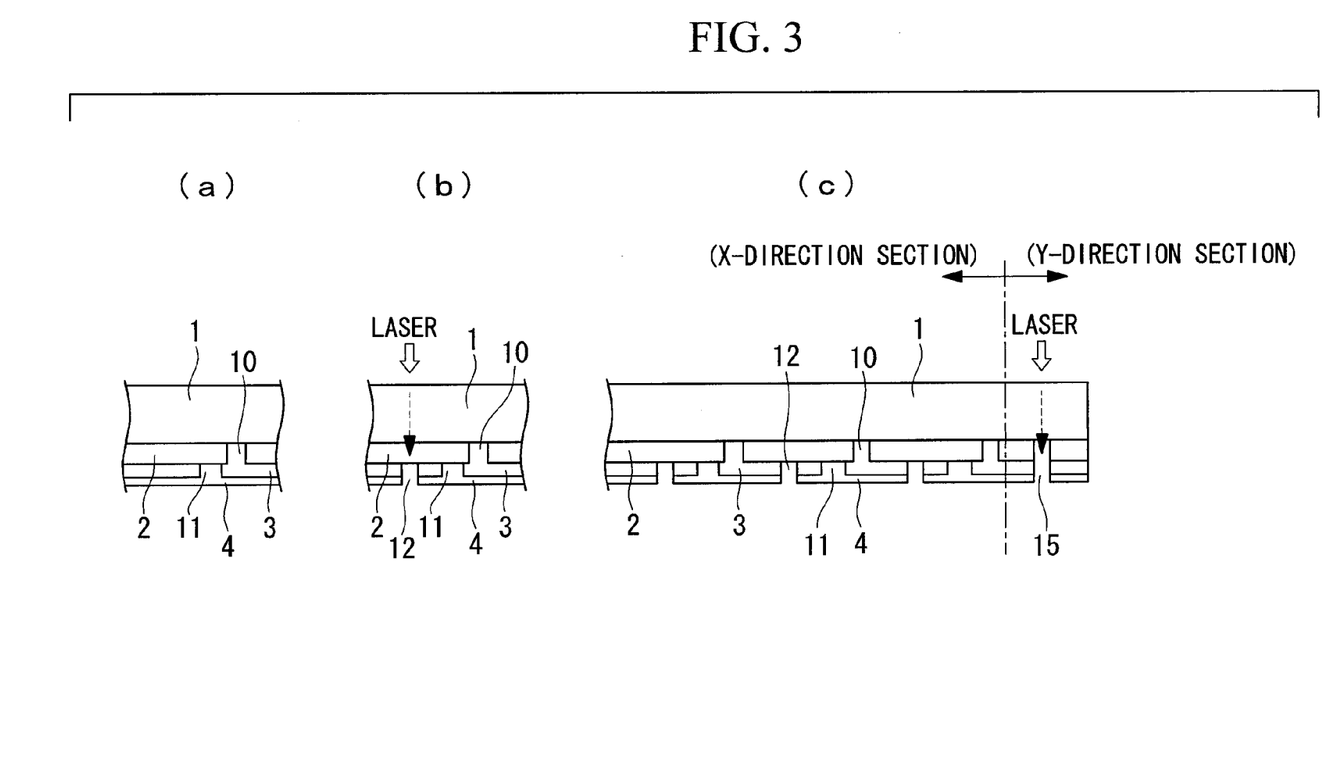
FIG. 3 is a view for explaining, in outline, the embodiment in which the solar cell panel is fabricated as the photoelectric conversion device according to the first embodiment of the present invention.

(6) FIG. 3(*a*)

As the back electrode layer 4, an Ag film/Ti film are formed by using a sputtering apparatus with a low-pressure atmosphere and a film-forming temperature of 150° C. to 200° C. In this embodiment, an Ag film having a film thickness of 150 nm to 500 nm, inclusive, and a Ti film having a film thickness of 10 nm to 20 nm, inclusive, which has a high anti-corrosion effect and serves to protect the Ag film, are laminated in this order. Alternatively, the back electrode layer 4 may have a laminated structure of an Ag film having a film thickness of 25 nm to 100 nm and an Al film having a film thickness of 15 nm to 500 nm. In order to improve the light reflectivity and reduce the contact resistance of the crystalline silicon n-layer 43 and the back electrode layer 4, a GZO (Ga-doped ZnO) film having a film thickness of 50 nm to 100 nm, inclusive, may be formed between the photoelectric conversion layer 3 and the back electrode layer 4, using a sputtering apparatus.

(7) FIG. 3(b)

The substrate 1 is placed on the X-Y table and is irradiated with the second harmonic (532 nm) of a laser-diode-pumped YAG laser from the substrate 1 side, as shown by the arrow in the figure. The laser light is absorbed in the photoelectric conversion layer 3, and the back electrode layer 4 is removed by blasting using the high gas vapor pressure generated during this process. The laser power is adjusted so as to be appropriate for the processing speed, with a pulse oscillation of 1 kHz to 10 kHz, inclusive, and laser etching is performed so as to form a groove 12 at a position 250 μm to 400 μm away laterally from the laser etching line on the transparent electrode layer 2.

Figure 4:
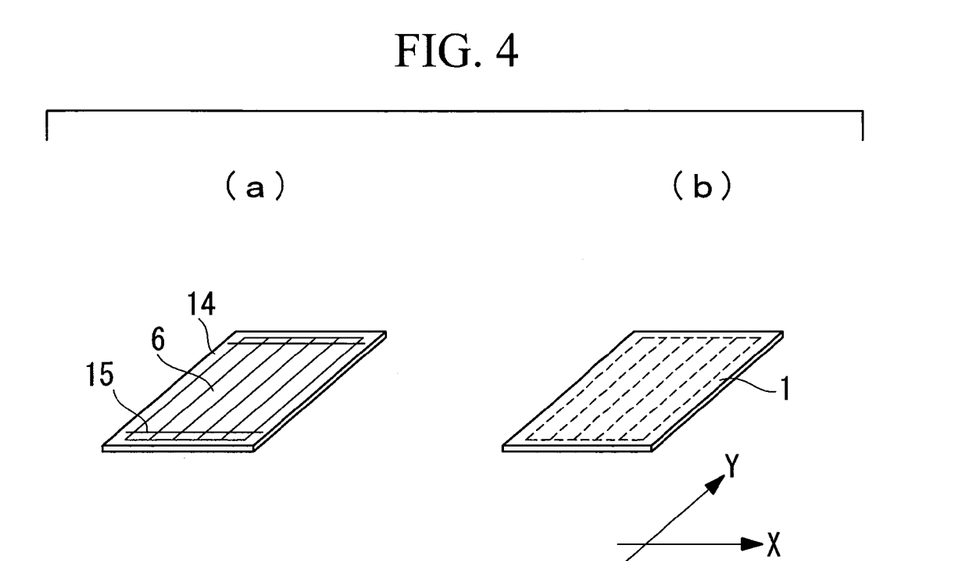
FIG. 4 is a view for explaining, in outline, the embodiment in which the solar cell panel is fabricated as the photoelectric conversion device according to the first embodiment of the present invention.

(8) FIG. 3(c) and FIG. 4(a)

The power generation region is divided to remove the influence of the risk of short-circuiting the series-connected portions produced through laser etching at film edge portions near the substrate edges. The substrate 1 is placed on the X-Y table and is irradiated with the second harmonic (532 nm) of a laser-diode-pumped YAG laser from the substrate 1 side. The laser beam is absorbed in the transparent electrode layer 2 and the photoelectric conversion layer 3, and the back electrode layer 4 is blasted using the high gas vapor pressure generated during this process, thereby removing the back electrode layer 4/the photoelectric conversion layer 3/the transparent electrode layer 2. The laser power is adjusted so as to be appropriate for the processing speed, with a pulse oscillation of 1 kHz to 10 kHz, inclusive, and laser etching is performed so as to form an X-direction insulating groove 15 at a position 5 mm to 20 mm away from the edge of the substrate 1, as shown in FIG. 3(c). Note that, since FIG. 3(c) is an X-direction sectional view seen from the direction in which the photoelectric conversion layers 3 are serially connected, a surrounding film-removed region 14 where the back electrode layer 4/the photoelectric conversion layer 3/and the transparent electrode layer 2 are removed through film polishing should be located at the position of the insulating groove 15 (see FIG. 4(a)); however, for the sake of convenience in explaining processing applied to the edge of the substrate 1, a description will be given of a case where a Y-direction section is shown at this position and the formed insulating groove is shown as the X-direction insulating groove 15. At this time, it is not necessary to provide a Y-direction insulating groove because a film-surface polishing and removing process is applied to the surrounding film-removed region on the substrate 1 at a later step.

Terminating the etching for the insulating groove 15 at positions 5 mm to 15 mm away from the edges of the substrate 1 is preferable because it affords an advantageous effect in that it is effective to suppress the ingress of external moisture from a solar cell panel edge into the interior of a solar cell module 6.

Note that a YAG laser is used as laser light in the above-described steps; however, a YVO4 laser or a fiber laser can be similarly used.

(9) FIG. 4(a: a View Seen from the Solar-Cell Film Surface Side and b: a View Seen from the Substrate Side, which is a Light-Receiving Surface)

Since the laminated films at the regions surrounding the substrate 1 (at the surrounding film-removed region 14) are uneven and likely to be peeled off, the films are removed to form the surrounding film-removed region 14, in order to provide a sound joining/sealing surface with a back sheet 24 via an EVA in a later step. The films are removed in the whole surrounding region with a width of 5 to 20 mm from the edges of the substrate 1. More specifically, the back electrode layer 4/the photoelectric conversion layer 3/the transparent electrode layer 2 are removed through grindstone polishing or blast polishing in portions closer, in the X direction, to the substrate edges than the insulating groove 15 provided in the above-described step shown in FIG. 3(c) and in portions closer, in the Y direction, to the substrate edges than the grooves 10 that are formed near the substrate edges.

Polishing dust or abrasive grains are removed by washing the substrate 1.

Figure 5:
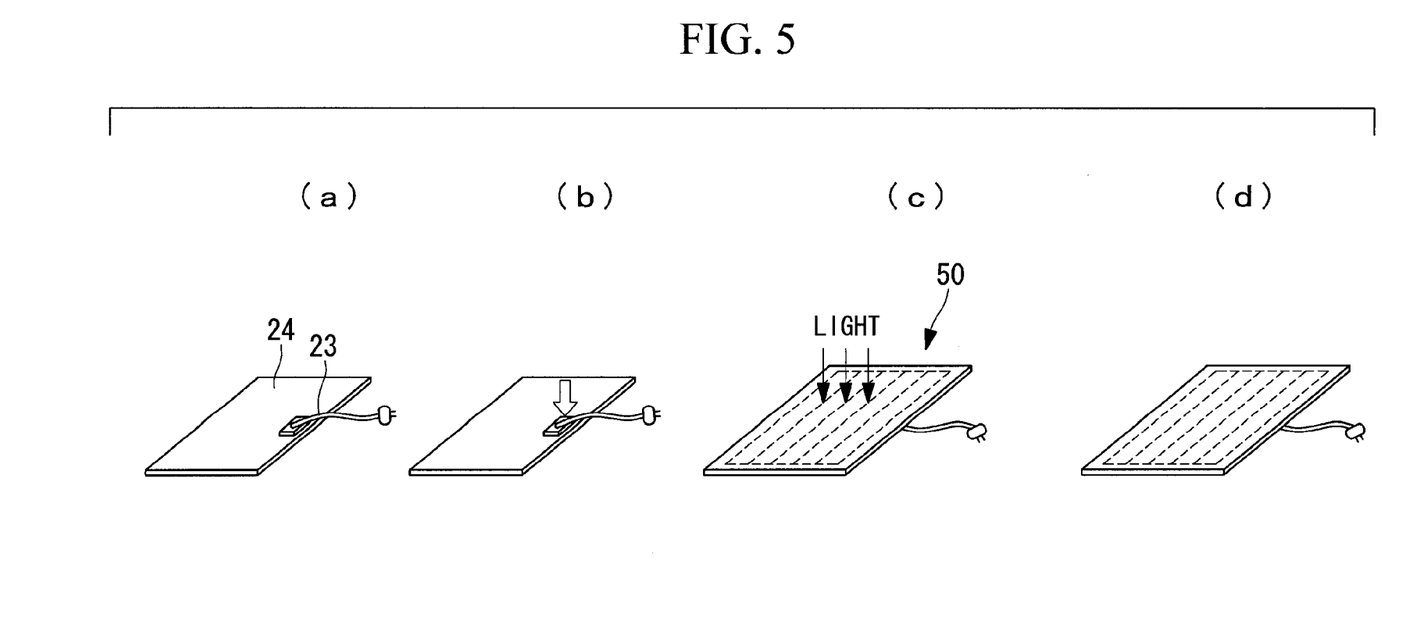
FIG. 5 is a view for explaining, in outline, the embodiment in which the solar cell panel is fabricated as the photoelectric conversion device according to the first embodiment of the present invention.

(10) FIGS. 5(a) and 5(b)

An opening pass-through window is provided in the back sheet 24 at a position where a terminal housing 23 is mounted, to lead out a current-collecting plate. A plurality of layers, formed of an insulating material, are provided for the opening pass-through window to suppress the ingress of external moisture etc.

Processing is performed so as to collect power, using copper foil, from the serially-arranged solar-cell power generation cells at one end and at the other end and to take out the power from the portion of the terminal housing 23 provided at the rear side of the solar cell panel. An insulating sheet having a larger width than the copper foil is disposed in order to prevent a short circuit between the copper foil and each part.

After the power-collecting copper foil etc. are disposed at predetermined locations, an adhesive packing sheet, such as EVA (ethylene vinyl acetate copolymer), is disposed so as to cover the entire solar cell module 6 and so as not to stick out from the substrate 1.

The back sheet 24, having a high waterproofing effect, is provided on the EVA. In this embodiment, the back sheet 24 is formed into a three-layer structure of PET sheet/Al foil/PET sheet, so as to achieve a high waterproofing and damp-proofing effect.

After the back sheet 24 is disposed at the predetermined location, while the inner air is deaerated in the low-pressure atmosphere by means of a laminator and pressing is performed at about 150 to 160° C., the EVA is cross-linked for sealing.

(11) FIG. 5(a)

The terminal housing 23 is mounted on the rear side of the solar cell module 6 with an adhesive agent.

(12) FIG. 5(b)

The copper foil and an output cable of the terminal housing 23 are connected by solder or the like, and the interior of the terminal housing 23 is filled with sealant (potting material) and sealed. Thus, a solar cell panel 50 is completed.

(13) FIG. 5(c)

A power generation check and predetermined performance tests are executed for the solar cell panel 50, formed through the steps up to the step shown in FIG. 5(b). The power generation check is executed using a solar simulator for an AM of 1.5 and global-solar-radiation standard sunlight (1000 W/m$^2$).

(14) FIG. 5(d)

Before or after the power generation check (FIG. 5(c)), predetermined performance tests, such as a visual inspection, are executed.

In the solar cell of this embodiment, since the resistivity of the intermediate contact layer 5 is controlled to be set to 10 kΩ/□ to 100 kΩ/□, inclusive, the leakage current in a cell-connected portion is reduced, and the contact resistance in the film lamination direction is reduced. Therefore, the form factor is increased, thus improving the photoelectric conversion efficiency.

Second Embodiment

A photoelectric conversion device according to a second embodiment includes an interfacial layer between the first power generation cell layer 91 and the intermediate contact layer 5, shown in FIG. 1.

The interfacial layer mainly contains ZnO or a compound represented by $Zn_{1-x}Mg_xO$ (where $0<x\leq0.096$ is satisfied). Specifically, the interfacial layer does not contain Mg, or contains an Mg content less than the intermediate contact layer. ZnO or $Zn_{1-x}Mg_xO$ used as the interfacial layer may contain $Ga_2O_3$ as a dopant.

The interfacial layer may be formed in a film-forming chamber different from or identical to that is used to form the intermediate contact layer.

When the interfacial layer and the intermediate contact layer are formed in different film-forming chambers, the interfacial layer and the intermediate contact layer are formed by the following steps.

The interfacial layer is formed, using an RF magnetron sputtering apparatus, under the following conditions: a $Ga_2O_3$-doped ZnO sintered compact or a $Ga_2O_3$-doped ZnO—MgO mixture target (MgO ratio: 0 to 5 mass %, excluding 0 mass %), an RF power of 1.1 to 4.4 W/cm$^2$, a film-forming pressure of 0.13 to 0.67 Pa, and a substrate temperature of 25° C. (near room temperature). Under the above-described conditions, the interfacial layer mainly containing ZnO or $Zn_{1-x}Mg_xO$ ($0<x\leq0.096$) is formed. When the contact resistance between the first power generation cell layer 91 and the interfacial layer and the leakage current in the cell-connected portion are taken into account, it is preferable to set the film thickness of the interfacial layer to 5 nm to 10 nm, inclusive.

After forming the interfacial layer, the intermediate contact layer that contains an MgO content more than the interfacial layer is formed under the same conditions as in the first embodiment. In this embodiment, the total film thickness of the interfacial layer and the intermediate contact layer is set to 20 nm to 100 nm, inclusive.

When the interfacial layer and the intermediate contact layer are formed in the same film-forming chamber, a substrate-transfer-type RF magnetron sputtering apparatus is used in which a $Ga_2O_3$-doped ZnO sintered compact or a $Ga_2O_3$-doped ZnO—MgO mixture target (MgO ratio: 0 to 5 mass %, excluding 0 mass %), and a $Ga_2O_3$-doped ZnO—MgO mixture target (MgO ratio: 5 to 10 mass %) are arranged in parallel. The substrate transfer speed and the width of each target in the substrate transfer direction are specified such that the film thickness of the interfacial layer is 5 nm to 10 nm, inclusive, and the total film thickness of the interfacial layer and the intermediate contact layer is 20 nm to 100 nm, inclusive. For example, under conditions substantially the same as the above-described conditions, film formation is executed while the substrate is being transferred from the side of the ZnO sintered compact or the low-Mg-content mixture target to the side of the high-Mg-content mixture target.

When the interfacial layer and the intermediate contact layer are formed in the same film-forming chamber, as described above, the interface between the interfacial layer and the intermediate contact layer is not distinct, unlike when they are formed in different film-forming chambers, and it is conceivable that the Mg content is increased continuously from the interfacial layer toward the intermediate contact layer.

In the solar cell of the second embodiment, the contact resistance between the first power generation cell layer and the interfacial layer is reduced more than the contact resistance between the first power generation cell layer and the intermediate contact layer in the first embodiment. Furthermore, when the interfacial layer is set to have a film thickness of 5 nm to 10 nm, inclusive, the leakage current in the cell-connected direction is further suppressed. Therefore, in the solar cell of the second embodiment, the photoelectric conversion efficiency is further improved.

EXAMPLES

Example 1

A tandem solar cell module having the structure shown in FIG. 1 was formed on a glass substrate (5 cm square). Note that the film thickness of the i-layer of the first power generation cell layer was 250 nm, and the film thickness of the i-layer of the second power generation cell layer was 1.9 μm.

The intermediate contact layer was formed under the following conditions: a ZnO sintered compact target ($Ga_2O_3$ dopant) or a ZnO—MgO mixture target ($Ga_2O_3$ dopant, MgO mass ratio: 5 to 12.5%), a substrate temperature of 25° C., an RF power of 4.4 W/cm$^2$, a target-to-substrate distance of 90 mm, a film-formation speed of 0.17 nm/s, and a film thickness of 70 nm.

Figure 7:
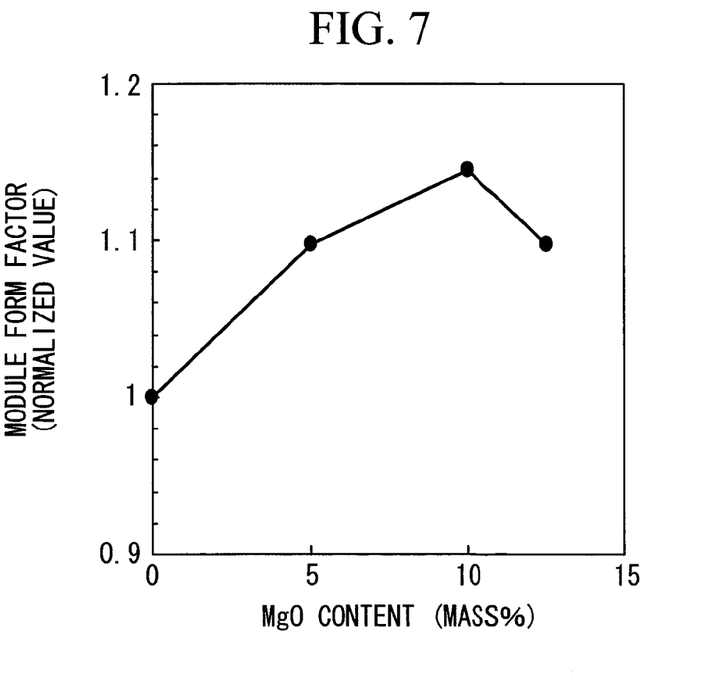
FIG. 7 is a graph showing the relationship between the MgO content in an intermediate contact layer and the module form factor.
Figure 8:
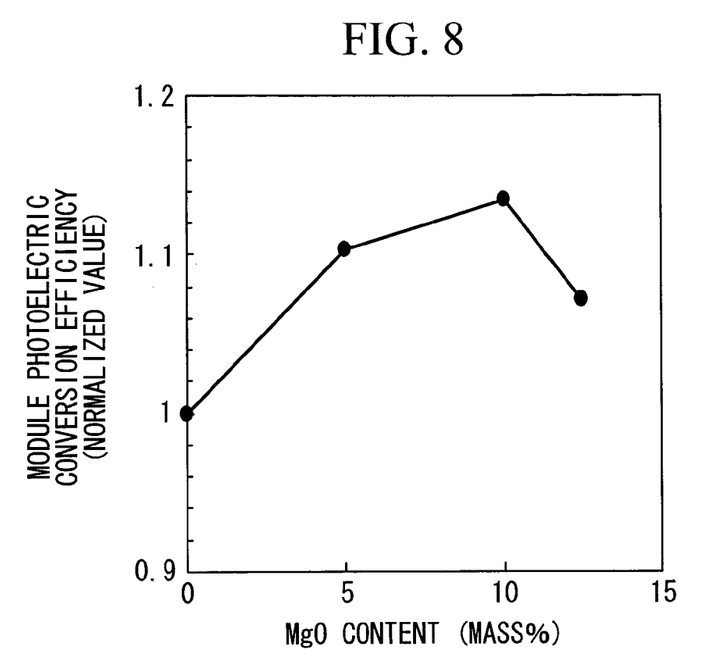
FIG. 8 is a graph showing the relationship between the MgO content in the intermediate contact layer and the module photoelectric conversion efficiency.

FIG. 7 shows the relationship between the MgO content in the intermediate contact layer and the module form factor. In the figure, the horizontal axis shows the MgO content, and the vertical axis shows the module form factor normalized by a value when the MgO content was 0%. FIG. 8 shows the relationship between the MgO content in the intermediate contact layer and the module photoelectric conversion efficiency. In the figure, the horizontal axis shows the MgO content, and the vertical axis shows the module photoelectric conversion efficiency normalized by a value when the MgO content was 0%.

As shown in FIGS. 7 and 8, the form factor and the photoelectric conversion efficiency were improved by using a ZnMgO material for the intermediate contact layer. When the MgO content fell within a range of 5 mass % (9.6 mol %) to 10 mass % (18.3 mol %), a high form factor and photoelectric conversion efficiency were obtained. When the MgO content exceeded 10 mass %, it was found that the form factor and the photoelectric conversion efficiency decreased because of an increase in contact resistance.

Example 2

A tandem solar cell module was formed on a glass substrate (5 cm square). Note that the film thickness of the i-layer of the first power generation cell layer was 250 nm, and the film thickness of the i-layer of the second power generation cell layer was 1.9 μm.

In the tandem solar cell module of Example 2, the interfacial layer was provided between the first power generation cell layer and the intermediate contact layer. The interfacial layer was formed using a ZnO sintered compact target ($Ga_2O_3$ dopant) under the same conditions as those used to form the intermediate contact layer in Example 1. The film thickness of the interfacial layer was 5 nm to 15 nm. The intermediate contact layer was formed using a ZnO—MgO mixture target ($Ga_2O_3$ dopant, MgO mass ratio: 10%) under the same conditions as in Example 1. The film thickness of the intermediate contact layer was 70 nm. Note that, in Example 2, the interfacial layer and the intermediate contact layer were formed in different film-forming chambers.

Figure 9:
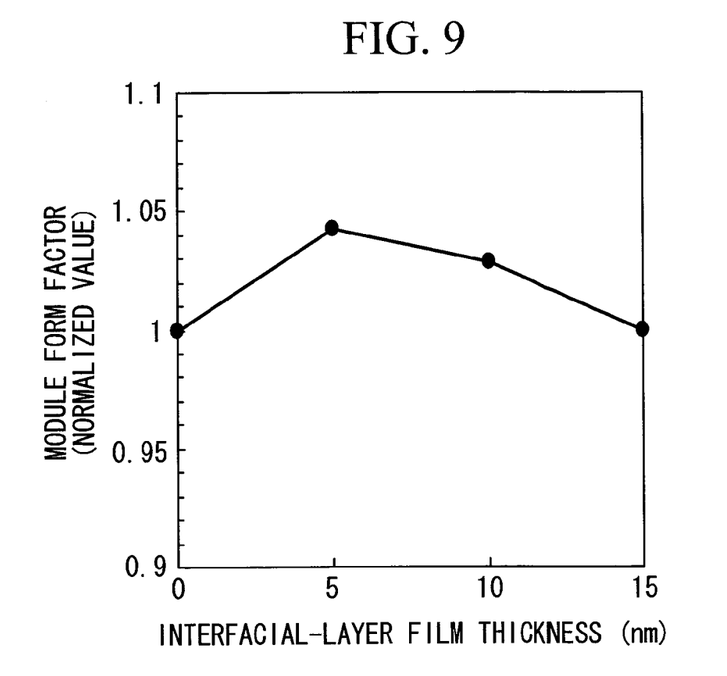
FIG. 9 is a graph showing the relationship between the interfacial-layer film thickness and the module form factor.
Figure 10:
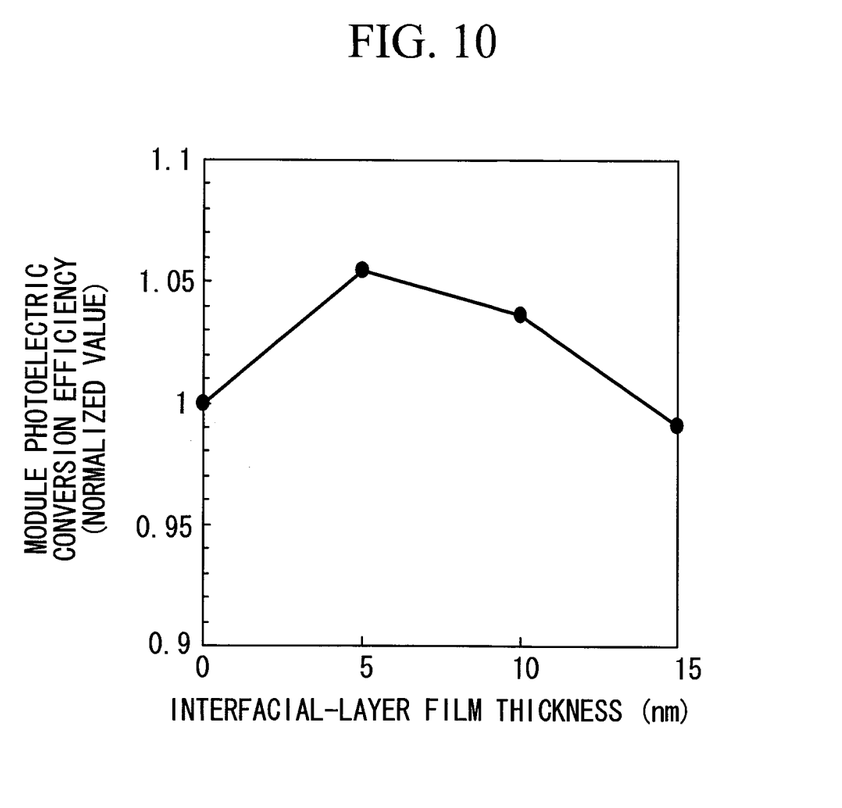
FIG. 10 is a graph showing the relationship between the interfacial-layer film thickness and the module photoelectric conversion efficiency.

FIG. 9 shows the relationship between the interfacial-layer film thickness and the module form factor. In the figure, the horizontal axis shows the interfacial-layer film thickness, and the vertical axis shows the module form factor normalized by a value when the interfacial-layer film thickness was 0 nm (only the intermediate contact layer). FIG. 10 shows the relationship between the interfacial-layer film thickness and the module photoelectric conversion efficiency. In the figure, the horizontal axis shows the interfacial-layer film thickness, and the vertical axis shows the module photoelectric conversion efficiency normalized by a value when the interfacial layer was not provided.

When the interfacial-layer film thickness was 5 nm to 10 nm, inclusive, the module form factor and the photoelectric conversion efficiency were improved, compared with a case where the interfacial layer was not provided. When the interfacial layer was 15 nm, the module form factor and the photoelectric conversion efficiency were reduced. It is conceivable that this is because, when the interfacial layer is thick, current leaks in the interfacial layer, and the contact properties deteriorate.

When the MgO content in the intermediate contact layer was set to 5 mass %, a similar effect was found.

Example 3

A tandem solar cell module having a structure similar to that in Example 2 was formed. In Example 3, the interfacial layer and the intermediate contact layer were formed in the same film-forming chamber.

A substrate-transfer-type film-forming apparatus was used in which eight targets were arranged in parallel in the substrate transfer direction. As one of the targets located close to the substrate introduction side (upstream side), a ZnO sintered compact target ($Ga_2O_3$ dopant) was used; and as the rest of the targets, ZnO—MgO mixture targets ($Ga_2O_3$ dopant, MgO mass ratio: 10%) were used. Film-forming conditions similar to those in Example 1 and Example 2 were used. Film formation was executed at a transfer speed such that the total film thickness of the intermediate contact layer became 70 nm.

In the tandem solar cell module of Example 3, the ratios of the form factor and the photoelectric conversion efficiency to those of a tandem solar cell module in which an intermediate contact layer was not formed were 1.03 and 1.05, respectively.

In the above-described embodiments, a description has been given of the tandem solar cells serving as a solar cell; however, the present invention is not limited thereto. For example, the present invention can also be similarly applied to a triple solar cell.

REFERENCE SIGNS LIST 1 substrate
2 transparent electrode layer
3 photoelectric conversion layer
4 back electrode layer
5 intermediate contact layer
6 solar cell module
31 amorphous silicon p-layer
32 amorphous silicon i-layer
33 amorphous silicon n-layer
41 crystalline silicon p-layer
42 crystalline silicon i-layer
43 crystalline silicon n-layer
91 first power generation cell layer
92 second power generation cell layer
100 photoelectric conversion device

The invention claimed is:

1. A photoelectric conversion device, comprising:
a substrate;
a photoelectric conversion layer over the substrate, the photoelectric conversion layer including at least first and second power generation cell layers;
an intermediate contact layer between the first and second power generation cell layers, the first power generation cell layer disposed between the substrate and the intermediate contact layer; and
an interfacial layer between the intermediate contact layer and the first power generation cell layer, wherein
the intermediate contact layer contains a $Zn_{1-x}Mg_xO$-based compound, where $0.096 \leq x \leq 0.183$, and a first dopant,
the interfacial layer contains a $Zn_{1-y}Mg_yO$-based compound, where $0 \leq y \leq 0.096$, and a second dopant, and
the interfacial layer has a lower Mg concentration than the intermediate contact layer.

2. A photoelectric conversion device according to claim 1, wherein the first dopant is $Ga_2O_3$.

3. A photoelectric conversion device according to claim 1, wherein a sheet resistance of the intermediate contact layer after being exposed to a hydrogen plasma is 10 kΩ/□ to 100 kΩ/□, inclusive.

4. A photoelectric conversion device according to claim 1, wherein the second dopant is $Ga_2O_3$.

5. A photoelectric conversion device according to claim 1, wherein a film thickness of the interfacial layer is 5 nm to 10 nm, inclusive.

6. A photoelectric conversion device according to claim 1, wherein $0.1 < x \leq 0.183$ in the $Zn_{1-x}Mg_xO$-based compound of the intermediate contact layer.

7. A photoelectric conversion device, comprising:
a substrate;
a photoelectric conversion layer over the substrate, the photoelectric conversion layer including at least first and second power generation cell layers;
an intermediate contact layer between the first and second power generation cell layers, the first power generation cell layer disposed between the substrate and the intermediate contact layer; and
an interfacial layer between the intermediate contact layer and the first power generation cell layer, wherein
the intermediate contact layer contains a $Zn_{1-x}Mg_xO$-based compound, where $0.096 \leq x \leq 0.183$,
the interfacial layer contains a $Zn_{1-y}Mg_yO$-based compound, where $0 \leq y \leq 0.096$, and
the interfacial layer has a lower Mg concentration than the intermediate contact layer.

8. A photoelectric conversion device according to claim 7, wherein the intermediate contact layer is free of $Ga_2O_3$.

9. A photoelectric conversion device according to claim 7, wherein $0.1 < x \leq 0.183$ in the $Zn_{1-x}Mg_xO$-based compound of the intermediate contact layer.

* * * * *